United States Patent [19]
Sullivan et al.

[11] Patent Number: 5,666,385
[45] Date of Patent: Sep. 9, 1997

[54] JITTER COMPENSATION CIRCUIT

[75] Inventors: James S. Sullivan; Don G. Ball, both of Livermore, Calif.

[73] Assignee: The United States of America as represented by the United States Department of Energy, Washington, D.C.

[21] Appl. No.: 340,408

[22] Filed: Nov. 15, 1994

[51] Int. Cl.$^6$ .............................. H04K 1/02; H04L 25/03; H04L 25/49
[52] U.S. Cl. .................... 375/296; 375/285; 332/107
[58] Field of Search ...................... 375/295, 296, 375/285, 317, 319; 332/106, 107, 114

[56] References Cited

U.S. PATENT DOCUMENTS

| | | | |
|---|---|---|---|
| 4,490,659 | 12/1984 | Hansen | 318/484 |
| 5,315,611 | 5/1994 | Ball et al. | 372/56 |

OTHER PUBLICATIONS

J.V. Hill and D.G. Ball, et al., "Reliable, High Repetition Rate Thyratron Grid Driver Used With a Magnetic Modulator", 8th IEEE Pulsed Power Conference.
"Timing and Voltage Control of Magnetic Modulators on ETA II" by M.A. Newton and J.A. Watson presented at the 7th IEEE International Pulsed Power Conference in Monterey, California, Jun. 1989.

*Primary Examiner*—Stephen Chin
*Assistant Examiner*—Betsy P. Lee
*Attorney, Agent, or Firm*—Townsend and Townsend and Crew LLP

[57] ABSTRACT

The instantaneous $V_{co}$ signal on a charging capacitor is sampled and the charge voltage on capacitor $C_o$ is captured just prior to its discharge into the first stage of magnetic modulator. The captured signal is applied to an averaging circuit with a long time constant and to the positive input terminal of a differential amplifier. The averaged $V_{co}$ signal is split between a gain stage (G=0.975) and a feedback stage that determines the slope of the voltage ramp applied to the high speed comparator. The 97.5% portion of the averaged $V_{co}$ signal is applied to the negative input of a differential amplifier gain stage (G=10). The differential amplifier produces an error signal by subtracting 97.5% of the averaged $V_{co}$ signal from the instantaneous value of sampled $V_{co}$ signal and multiplying the difference by ten. The resulting error signal is applied to the positive input of a high speed comparator. The error signal is then compared to a voltage ramp that is proportional to the averaged $V_{co}$ values squared divided by the total volt-second product of the magnetic compression circuit.

7 Claims, 7 Drawing Sheets

JITTER COMPENSATION CIRCUIT

GOVERNMENT RIGHTS

The United States Government has rights in this invention pursuant to Contract No. W-7405-ENG-48 between the United States Department of Energy and the University of California.

TECHNICAL FIELD

The present invention relates generally to jitter compensation and, more particularly, to a jitter compensation system which compensates for variations of voltage on the storage capacitor that provides the input energy for a pulsed power electronic (PPE) systems. The present invention is particularly useful where the variations in the storage capacitor voltage occur due to the voltage regulation of an energy source, which produce variation in the timing delays through the magnetic pulse compression components in the PPE.

BACKGROUND OF THE INVENTION

Jitter for a PPE system refers to variations in the time interval between a master timing trigger pulse applied to the input of the PPE modulator and the output pulse from the PPE modulator. The primary source of jitter in the PPE modulator is due to imperfect dc-voltage regulation of a switching power supply which supplies electrical energy to the PPE modulator. Variations in the output voltage of the switching power supply produce corresponding voltage variations in the $V_{co}$ voltage on the energy storage capacitor $C_o$. These voltage variations on $C_o$ produce variations in the time delay through the magnetic assist and magnetic switches present in the magnetic pulse compression circuitry of the PPE modulator.

The time delay through a magnetic assist is given as:

$$T_d = V_{nom} T_{dnom}/V_{op} \qquad (1)$$

Where $T_d$ represents the time delay through the magnetic assist. For a magnetic assist, the term $V_{nom} T_{dnom}$ represents the volt-second product of the magnetic assist, which is a constant for a given design. $V_{op}$ is the nominal charge voltage on the capacitor $C_o$.

For magnetic switches, equation (1) is also used to calculate the time delays of the magnetic switches by replacing $V_{op}$ by the average voltage applied to the particular magnetic compression stage during its "charge time".

The delay time is inversely proportional to $V_{op}$ for either case.

The traditional approach to jitter compensation for a PPE system is to derive the electronic time delay required to cancel the magnetic time delay by comparing a signal proportional to $V_{co}$ to a linear voltage ramp. Changes in $V_{co}$ will produce changes in the amount of time it takes for the linear voltage ramp to reach the magnitude of the voltage signal proportional to $V_{co}$. If the correct slope is chosen for the linear voltage ramp, the variation in time delay in the jitter compensation circuit will cancel the variation in time delay in the PPE modulator magnetic compression circuits due to variations in $V_{co}$.

The traditional approach requires a linear voltage ramp that produces an electronic time delay in the jitter compensation circuit where the electronic time delay is exactly equal to the magnetic time delay through the PPE modulator for a given charge voltage. This is expressed in the Equation (2) below:

$$T_{de} = T_{dm} \qquad (2)$$

Where $T_{de}$ and $T_{dm}$, respectively, represent the time delays through the jitter compensation and magnetic compression circuits. This method represents a "global" approach to jitter compensation because the time delay in the jitter compensation circuit must always equal the magnetic time delay through the PPE modulator. A modulator having a time delay of 9.5 ms for full power operation would require a jitter compensation circuit with a 9.5 ms delay. To achieve an overall jitter requirement of 2 ns peak to peak, this compensation approach would require a high speed, high voltage (50 V input) comparator.

The nature of the charge voltage signal ($V_{co}$) for a modulator driving a load device, such as a high power copper vapor laser, constrains a jitter compensation circuitry. This is due to the relatively small amount of voltage variation on the $V_{co}$ peak charge voltage and large volt second product of the magnetic modulator. Since it is the voltage variation that is of interest, the 5–6 volt peak to peak voltage variation riding on 950–1000 volt signal gives a poor total-signal to noise ratio. Small voltage variations produce a large amount of jitter, or temporal variation, in the modulator output pulse. The traditional method of jitter compensation described above requires a voltage ramp that is proportional to the voltage variation on the peak value of $V_{co}$ divided by the temporal variation (jitter) it produces. This method of jitter compensation requires a relatively slow voltage ramp since the voltage variation is small and the amount of jitter is large. Tests of high speed comparators indicates that a voltage ramp of greater than 6 V/$\mu s$ is required to reduce comparator jitter to an acceptable level.

To meet the requirements of 2 ns peak to peak jitter on the output pulse of a high power magnetic modulator, a need exists for an improved technique for jitter compensation.

SUMMARY OF THE INVENTION

It is, therefore, an object of the present invention to provide an improved technique for jitter compensation.

In accordance with this and other objects of the invention, an improved technique provides jitter compensation using a "local" approach to compensation. This approach is expressed in Equation (3):

$$DT_{de} = -DT_{dm} \qquad (3)$$

In this approach, the ramp speed is chosen so that variations in the time delay through the jitter compensation circuit are equal and opposite to the variations in magnetic modulator time delays.

The jitter compensation technique according to the invention was developed to compensate for large timing delay variations of ±80 ns due to small percentage changes in the voltage on storage capacitors used for improved magnetic compression circuits. The ability to accommodate increased amounts of temporal jitter is achieved by changing the signals that are used to produce the electronic time delay in a jitter compensation circuit.

Instead of comparing a signal proportional to the charge voltage to the linear voltage ramp in order to generate an appropriate time delay, the invention compares a linear voltage ramp to an "error" signal. The error signal is structured to allow large electronic time delay variations for comparatively small variation in PPE storage capacitor voltages. The error signal is structured to amplify small variation in charge voltage to produce a large electronic time delay.

The error signal according to the invention is developed by first subtracting the average peak charge voltage from the instantaneous peak charge voltage on the storage capacitor and then by multiplying the resulting difference by a gain factor. The average peak charge voltage is obtained by sampling the instantaneous charge voltage on the storage capacitor and applying the sampled voltages to an averaging circuit. In one embodiment of the invention the instantaneous charge voltage is averaged over the last 100,000 charging pulses.

One difference for a system according to the invention is that the error signal, which is compared to the linear voltage ramp signal, is proportional to the variation in charge voltage, rather than proportional to the total charge voltage. Therefore, larger electronic time delays are produced for relatively small variation in charge voltage magnitude. Use of the error signal is an important difference over conventional jitter compensation systems.

Another difference is that the jitter compensation circuit according to the invention uses feedback control to generate an appropriate slope for the linear voltage ramp generator. Consequently, after an initial set-up adjustment, no manual adjustments are required to produce an appropriate linear voltage ramp slopes.

The invention provides a jitter compensation system for the trigger signal for a voltage-dependent magnetic modulator which is powered from an energy storage capacitor having a $V_{co}$ voltage. Sampling means are provided for sampling a signal representative of the $V_{co}$ voltage and for providing sampled $V_{co}$ signals. Averaging means provide for averaging the sampled $V_{co}$ signal signals to provide an average $V_{co}$ signal. Difference means provide for taking the difference between the average $V_{co}$ signal and each of the sampled $V_{co}$ signals and for providing a difference signal. Means are provided for generating a voltage ramp signal. Comparator means, having a first input terminal for receiving the difference signal and having a second input terminal for receiving the voltage ramp signal, provide an output trigger pulse when the voltage ramp signal exceeds the difference signal.

The jitter compensation system includes means for generating a voltage ramp signal include using means for squaring the average $V_{co}$ signal to provide a squared average $V_{co}$ signal and means for generating a voltage ramp signal proportional to a squared average $V_{co}$ signal. The means for generating a voltage ramp signal proportional to a squared average $V_{co}$ signal includes current source means for providing an output current proportional to the squared average $V_{co}$ signal and also includes a capacitor for receiving the output current of the current source means so that the voltage ramp signal is proportional to the squared average $V_{co}$ signal.

The invention provides a method for compensating for voltage-dependent timing variations in a pulsed magnetic modulator, where the timing variations are caused by variations in the $V_{co}$ voltage provided on an energy storage capacitor, comprising the steps of: sampling the $V_{co}$ voltage to provide a plurality of sampled $V_{co}$ signals; averaging the plurality of sampled $V_{co}$ signals to provide an averaged $V_{co}$ signal; taking the difference between the averaged $V_{co}$ signal level and each of the sampled $V_{co}$ signals and providing a difference signal for each of said plurality of sampled $V_{co}$ signals; squaring the average $V_{co}$ signals to provide squared average $V_{co}$ signals; generating a voltage ramp signal for each sampled $V_{co}$ signal, where the voltage ramp signal has a slope proportional to the squared averaged $V_{co}$ signal; and comparing the difference signal with the voltage ramp signal and providing an output trigger pulse when the voltage ramp signal exceeds the difference output signal.

BRIEF DESCRIPTION OF THE DRAWINGS

The accompanying drawings which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
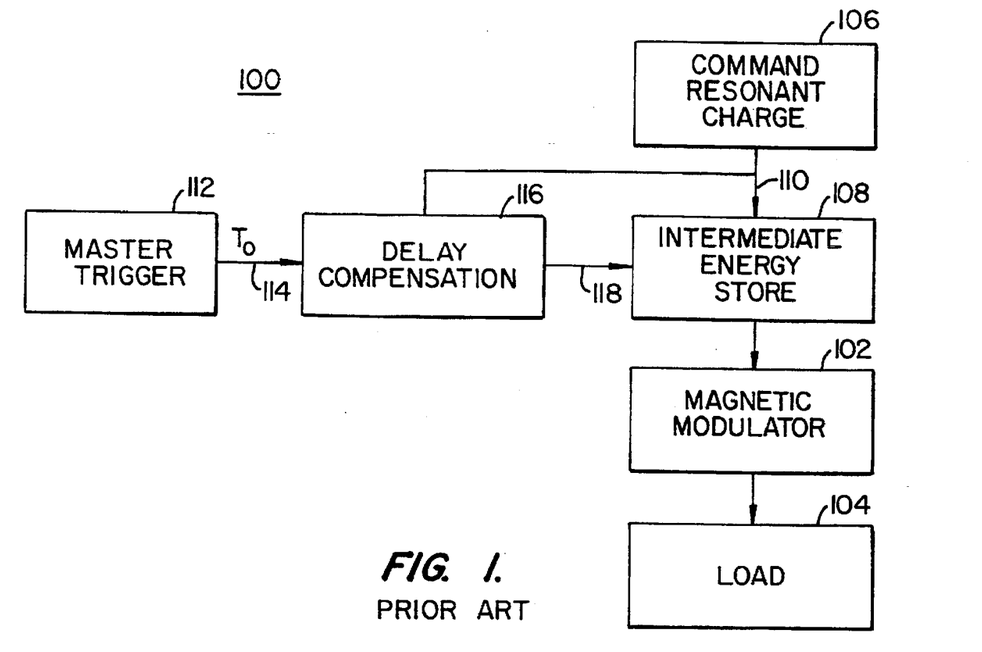
FIG. 1 is a block diagram of a conventional PPE system which has a delay compensation circuit to provide a time delay for a trigger pulse for a voltage-sensitive magnetic modulator.

FIG. 1 is a block diagram of a pulsed power electronic (PPE) system 100 which has a voltage-sensitive magnetic modulator 102 for driving a load device 104, such as a laser system or a linear induction cell. A command resonant charge circuit 106 charges an intermediate energy storage device 108, such as a capacitor, by providing a regulated charging voltage on a line 110. The energy storage device 108 is discharged into the magnetic modulator 102 at an appropriate time. A master trigger signal To is provided from a master trigger source 112 on a signal line 114 to a delay, or jitter, compensation circuit 116. The delay compensation circuit 116 monitors the regulated charging voltage on line 110 and provides a time delayed output pulse on signal line 118 to discharge the intermediate energy storage device 108 into the magnetic modulator 102.

The purpose of the jitter compensation circuit 116 is to compensate for variations in voltage on the storage capacitors of the intermediate energy storage device 108, which provide the input energy for the PPE circuit. Variation in the storage capacitor voltages are due to the imperfect voltage regulation of the energy source for the command resonant charge circuit 106. Variation of the storage capacitor voltage produce timing delay changes through the magnetic compression components of the magnetic modulator 102, which results in jitter on the output pulse from the system.

The purpose of the jitter compensation circuit 116 is to insert an electronic time delay in the trigger signal that cancels the timing delay changes that occur in the magnetic modulator 102 due to voltage variation on the storage capacitors. This reduces the jitter on the output pulse from the system.

Figure 2:
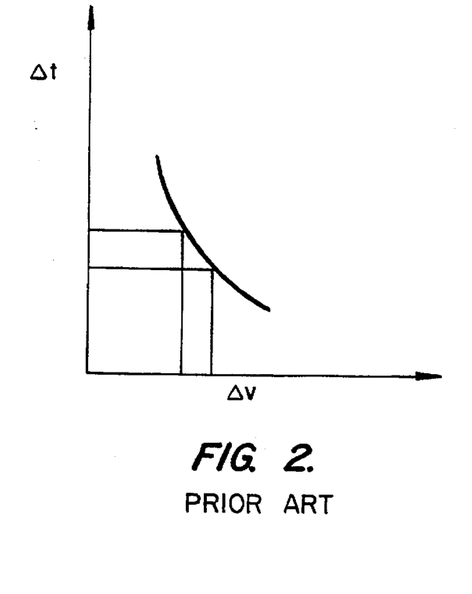
FIG. 2 is a plot of the voltage versus time characteristic for the voltage-sensitive magnetic modulators used in the system of FIG. 1.

FIG. 2 shows the voltage versus time characteristics for the delay of a voltage-sensitive magnetic modulator of FIG. 1. The voltage-time product for an individual magnetic modulator is a constant so that greater supply voltages produce shorter delay times through the modulator.

Figure 3:
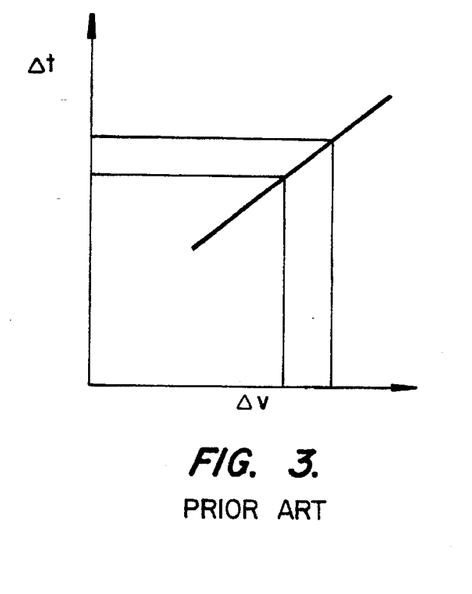
FIG. 3 is a plot of the voltage versus time characteristic for the voltage ramp delay compensation circuit of FIG. 1.

FIG. 3 is a plot of a linear voltage ramp versus time characteristic for the delay compensation circuit 116 of FIG. 1.

Figure 4:
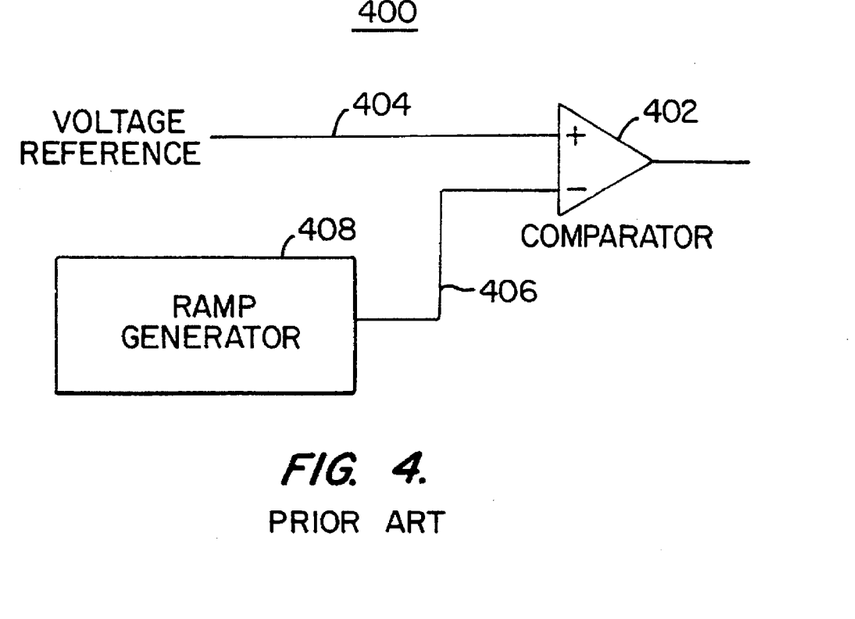
FIG. 4 is a block diagram of a comparator circuit for the pulse delay compensation circuit of FIG. 1.

FIG. 4 shows a pulse delay compensation circuit 400 which uses a comparator 402 to produce an appropriate time delay. The comparator 402 compares a signal proportional to the storage capacitor voltage received on a signal line 404 to a linear voltage ramp signal received on a signal line 406 from a ramp generator circuit 408. Changes in the charge voltage will produce changes in the amount of time it takes for the linear voltage ramp to reach the magnitude of the signal proportional to the charge voltage. If the correct slope is chosen for the linear voltage ramp signal, the variation in time delay in the jitter compensation circuit will cancel the time delays through the magnetic compression circuit due to charging voltage variation.

In system applications such as described in connection with FIG. 1, the charge voltage magnitudes are on the order of tens of kilovolts. A one percent variation in the charge voltage produces relatively small variations in time delay through the circuit magnetic components. These time delays are of the order ±10 ns. In addition, manual adjustment of the linear voltage ramp is required to achieve optimum performance of the jitter compensation circuitry. The change in time delay through the magnetic modulators, due to small percentage changes in charge voltage, is relatively small.

Figure 5:
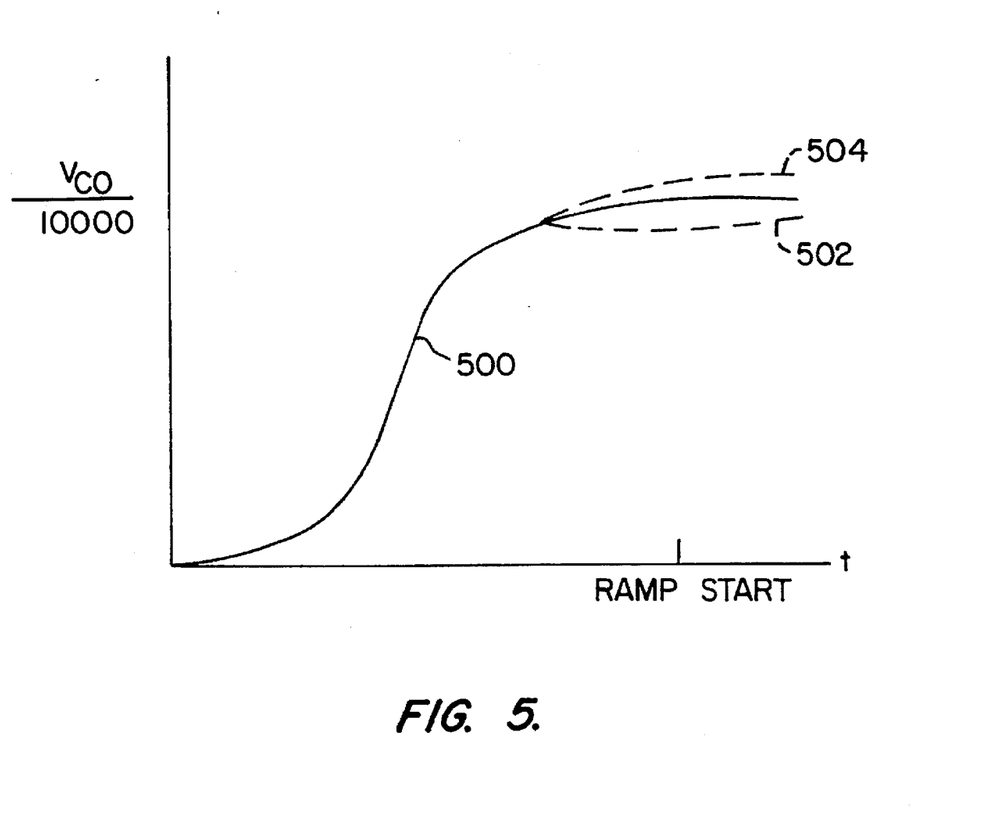
FIG. 5 is a time versus voltage plot for the VCO signal of the delay compensation circuit of FIG. 4.

FIG. 5 shows a nominal plot 500 of time versus voltage for a signal proportional to the energy storage capacitor voltage ($V_{co}$) for the delay compensation circuit of FIG. 4. The capacitor charge voltage $V_{co}$ is divided by 10,000 and applied to the input signal line of the comparator 402. The nominal plot 500 represents the capacitor charging to a nominal full value. Variations in the regulation of the power supply for charging the capacitor produce charging voltages which fall within a band of voltages, as represented by the lines 502, 504. These variations in supply voltage will produce variations in the output pulses from the magnetic modulator 102 of FIG. 1.

Figure 6:
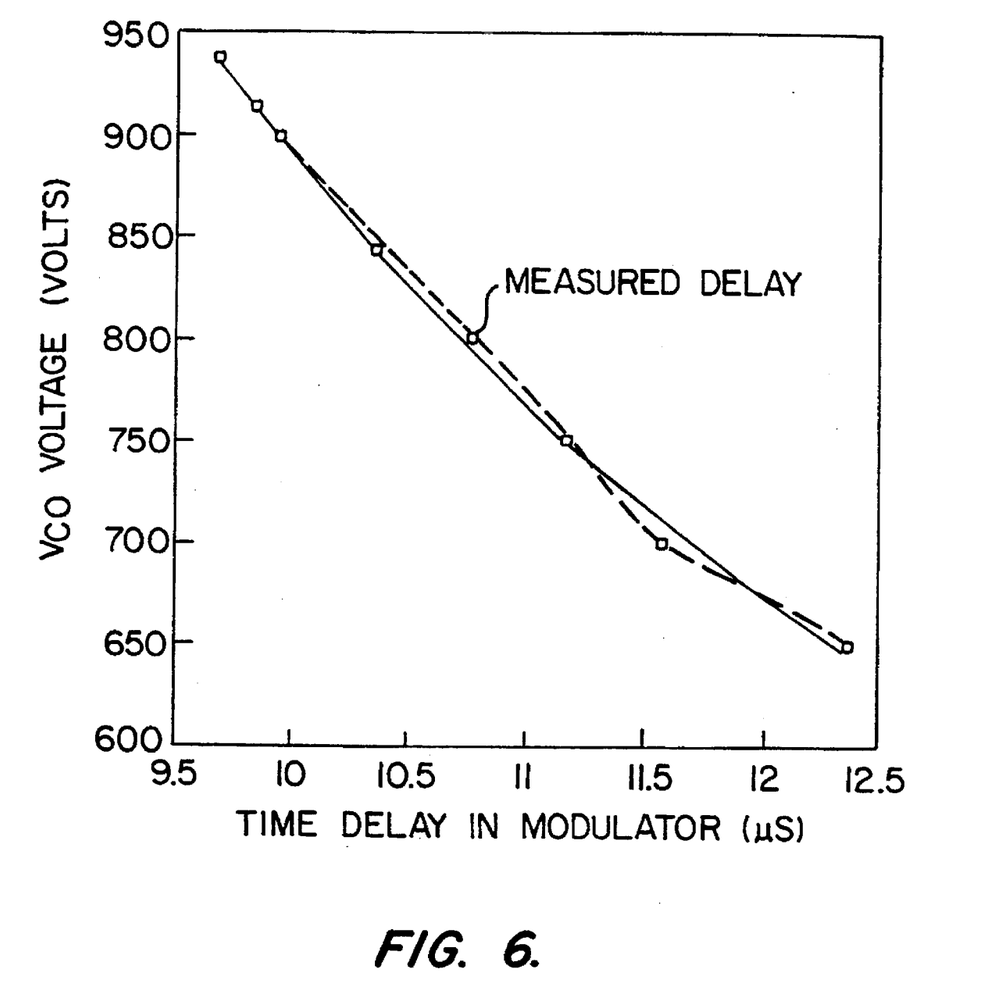
FIG. 6 is a characteristic plot of time versus VCO for a low input voltage, high power magnetic modulator.

FIG. 6 is a characteristic plot of time versus $V_{co}$ for a low input voltage, high power magnetic modulator. The time delay through the magnetic switch is given as:

$$T_d = V_{nom} T_{dnom}/V_{op}, \quad (4)$$

Where $T_d$ represents the time delay through the magnetic switch and where the term $V_{nom} T_{dnom}$ represents the volt-second product of the magnetic switch, which is a constant for a given design. $V_{op}$ is the average voltage applied to the magnetic switch during its "charge time". The delay time is inversely proportional to $V_{op}$. FIG. 6 shows an example of this relationship in the attached plot of total time delay through a magnetic modulator, or switch versus the charge voltage on capacitor $C_o$ ($V_{co}$). The variation of $V_{co}$ is usually 5–6 volts peak to peak throughout the entire range of SPS operating voltage settings. This variation of the $V_{co}$ voltage will produce 80–100 ns and 40 to 45 ns peak to peak jitter at operating voltages of 650 and 950 volts respectively. The purpose of a jitter compensation circuit is to add or subtract an electronic time delay that will accurately cancel the variation in time delay through the PPE modulator magnetic components due to voltage variations on $V_{co}$.

Figure 7:
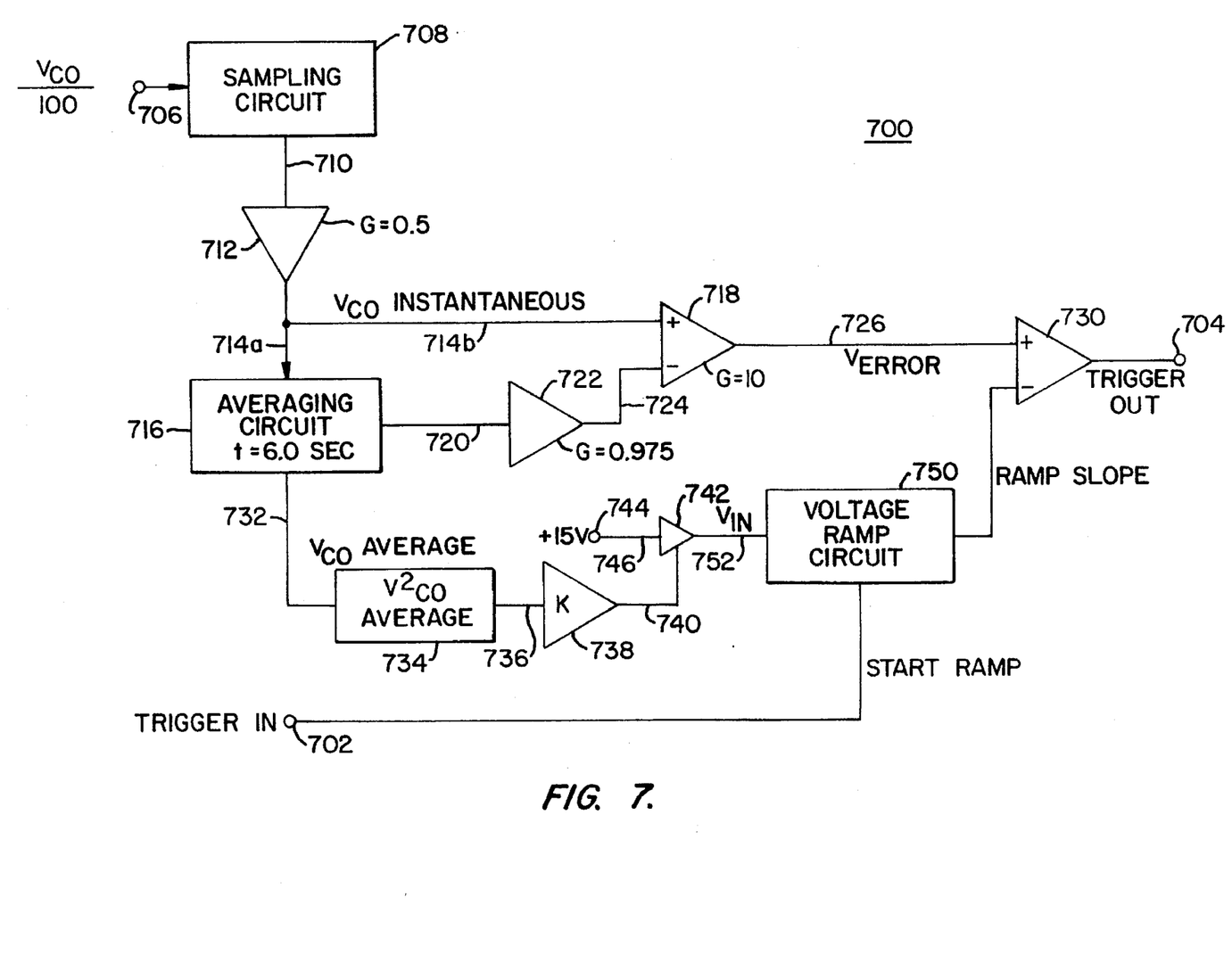
FIG. 7 is a block diagram for a jitter compensation circuit according to the invention for use with a magnetic modulator having the characteristic of FIG. 6.

FIG. 7 shows a jitter compensation system 700 according to the invention for delaying a trigger signal for a magnetic modulator having a characteristic similar to that of FIG. 6. A trigger input pulse from a trigger source is provided at an input terminal 702. A delayed trigger pulse is provided at a trigger output terminal 704. The jitter compensation system 700 compensates for large magnetic modulator output pulse delay variations of ±80 ns, which are due to small percentage changes in the voltage on the pulsed power electronic storage capacitors. The large pulse delays are the result of lower charge voltage on the initial stage of magnetic compression and the larger volt-second product of the magnetic modulaters being used.

The ability to remove an increased amount of temporal jitter is achieved by changing the signals used to produce the required electronic time delay in the jitter compensation system 700. Instead of comparing a signal proportional to the charge voltage on the charging capacitor to a linear voltage ramp to generate an appropriate time delay, the invention compares an error signal to a linear voltage ramp. The error signal according to the invention is structured to allow large electronic time delay variations for comparatively small variations in the storage capacitor voltage. The error signal amplifies any small variations in the charge voltage to produce a large electronic time delay. The voltage $V_{co}$ on the charging capacitor is provided at a series of charging pulses at a rate of, for example, of four kilohertz. A trigger output pulse at terminal 704 initiates transfer of electrical energy from energy storage capacitor to the magnetic modulator. The magnetic modulator, or switch, changes state after a time delay determined by the volt-time product of the magnetic modulator.

A precision, high voltage probe provides a 1 per cent fraction of the instantaneous $V_{co}$ signal to the jitter compensation circuit on the input terminal 706 of a sample-and-hold circuit 708 as a scaled $V_{co}$ signal. The instantaneous $V_{co}$ signal is sampled and the charge voltage on capacitor $C_o$ is captured just prior to its discharge into the first stage of magnetic compression. The sample-and-hold circuit 708 stores the instantaneous peak value of the scaled $V_{co}$ signals. The instantaneous peak value of the scaled $V_{co}$ signals is fed on a signal line 710 to an amplifier 712 where it is divided by two.

The output signal of the amplifier 712 is provided on a signal line 714a to the input terminal of an averaging circuit and on a signal line 714b to the non inverting input terminal of a differential amplifier 718. The averaging circuit 716 has a time constant of 6 seconds so it is averaging over the last 100,000 samples of $V_{co}$. An averaged $V_{co}$ signal is provided on an output signal line 720 to the input terminal of a gain stage 722 having a gain of 0.975. A signal with an amplitude of 97.5% of the averaged $V_{co}$ signal is provided on a signal line 724 to the inverting input terminal of the differential amplifier 718. The differential amplifier has a gain of 10 and produces an error signal by subtracting 97.5% of the averaged $V_{co}$ signal from the instantaneous value of sampled $V_{co}$ signal and multiplying the difference by ten.

The resulting error signal from the differential amplifier 718 is applied through a signal line 726 to the positive input terminal of a high speed comparator 730.

An averaged $V_{co}$ signal is also provided on an output signal line 732 from the averaging circuit 716 to the input terminal of a squaring circuit 734. The output signal of the squaring circuit 734 is applied through a signal line 736 to the input terminal of a gain stage 738 having a gain of K. The output signal of the gain stage 738 is provided on a signal line 740 to the inverting input terminal of a differential amplifier 742. The non inverting input terminal of the differential amplifier 742 is connected to a +15 volt terminal 744 through a signal line 746.

A control terminal of a voltage ramp generation circuit 750 receives a ramp-control voltage signal on a signal line 752 from the output terminal of the differential amplifier 742. The ramp-control signal determines the slope of the voltage ramp signal provided at the output terminal of the voltage ramp generator circuit 750. The voltage ramp is proportional to the averaged $V_{co}$ values squared divided by a constant proportional to the total volt-second product of the magnetic compression circuits of the switch. The voltage ramp signal is applied to negative input terminal of the high speed comparator 730. The start of a voltage ramp signal is initiated by an input trigger signal being received on terminal 702.

The error signal at the positive input terminal of the high speed comparator 730 is compared to the voltage ramp signal. The advantage to this approach is that a much better signal to noise ratio is obtained by subtracting 97.5% of the average or dc value of the sampled $V_{co}$ signal from the instantaneous sample of $V_{co}$ signal. The resulting difference signal is then amplified so that faster voltage ramp speeds are required to produce the proper electronic time delays for cancellation of jitter, which results in lower signal jitter produced by the comparator. This approach is used for jitter compensation of magnetic modulators over a wide range of volt-second products.

An essential difference between the conventional jitter compensation circuit and the system according to the invention is the use of an error signal which is produced by subtracting the average peak charge voltage from the instantaneous peak charge voltage and multiplying the result by a gain factor. The average peak charge voltage is obtained by sampling the instantaneous charge voltage, and applying the sampled voltages to an averaging circuit that averages the instantaneous charge voltage over the last 100,000 charging pulses. The error signal is compared to the linear voltage ramp to produce a signal which is proportional to the differences or variations in the charge voltage rather than proportional to the total value of the charge voltage. Consequently, larger electronic time delays are produced for relatively small variation in the charge voltage magnitude.

A second fundamental difference is that the jitter compensation system according to the invention has a feedback control signal to generate the appropriate slope for the linear voltage ramp signal. After initial set up, no manual adjustments are required to produce the appropriate linear voltage ramp slopes.

Figure 8A:
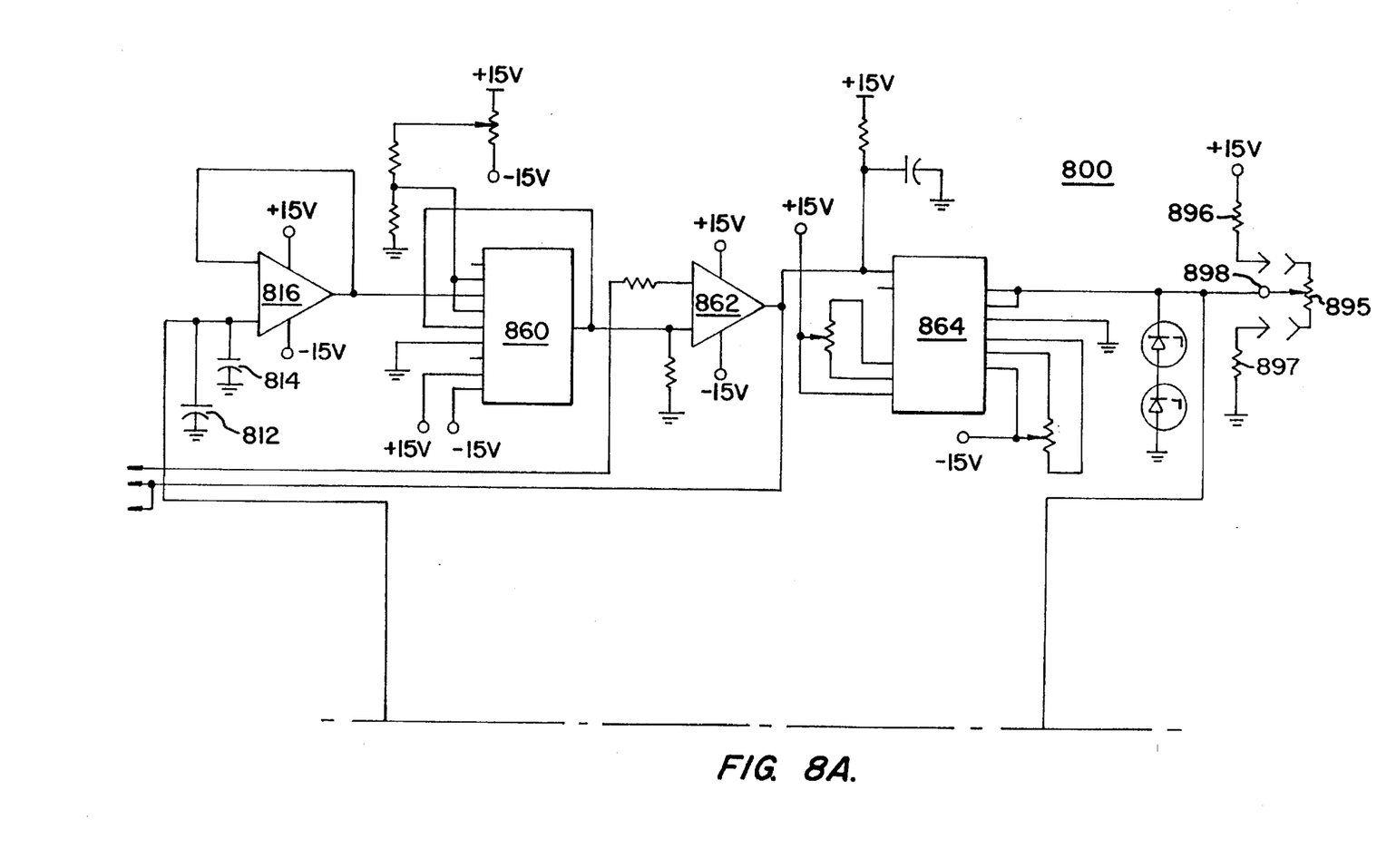
FIGS. 8A and 8B are a circuit diagram of a jitter compensation circuit according to the invention.
Figure 8B:
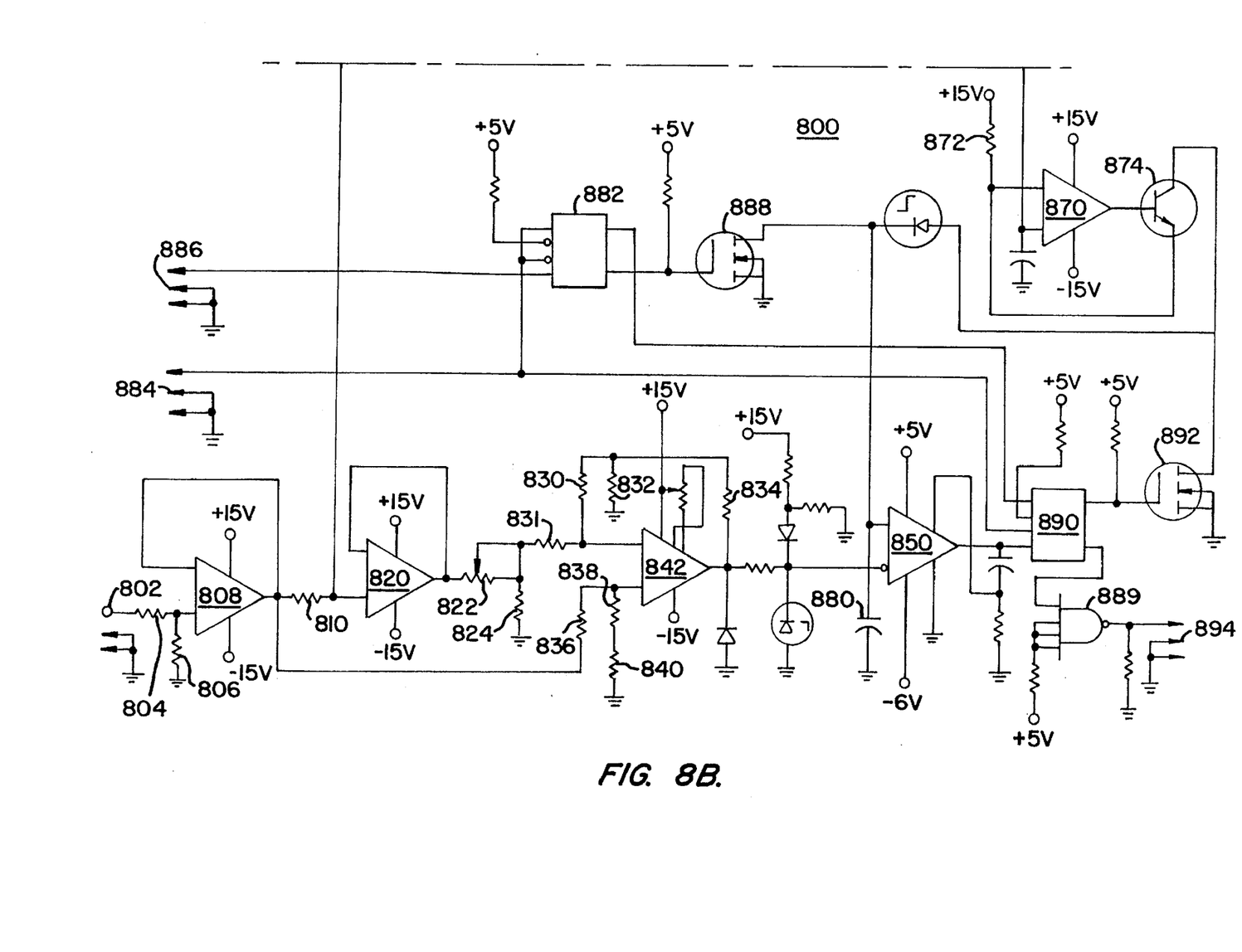

FIG. 8 is a detailed circuit diagram of a jitter compensation system 800 according to the invention, showing in more detail some of the elements of the system 700 of FIG. 7. A sampled $V_{co}$ signal is applied to terminal 802. Resisters 804, 806 and an op amp 808 provide a gain of 0.5. A series resistor 810 and shunt capacitors 812 and 814 connected to the negative input terminal of the op amp 816 form an averaging circuit. Op amp 820 and resistors 822, 824 provide a gain stage of 0.975 for the averaged $V_{co}$ signal. Resistors 830, 832, 834, 831, 838, 840 and an op amp 842 form a differential amplifier for subtracting 0.975 percent of the averaged $V_{co}$ signal from the instantaneous $V_{co}$ signal and for providing a gain of ten for the resultant difference signal. The difference output signal from op amp 842 is connected to the negative input terminal of a comparator 850.

The output signal from the op amp 816 is fed to the x and y input terminals of a multiplier circuit 860 to provide a squared average $V_{co}$ signal. The squared average $V_{co}$ signal is amplified in an op amp stage 862 and an instrumentation amplifier 864. The output signal of the instrumentation amplifier is fed to the positive input terminal of an operational amplifier 870. The negative input terminal of the op amp 870 is connected through a resistor 872 to a positive 15 volt supply and to the emitter terminal of a pnp transistor 874. The base terminal of the transistor 874 is connected to the output terminal of the op amp 870. The transistor 874 functions as a variable current source controlled by the squared average $V_{co}$ signal. The collector of the transistor 874 is connected to a shunt charging capacitor 880 and to the positive input terminal of the comparator 850. A linear voltage ramp is developed on the positive input terminal of the comparator 850 by charge accumulating on the capacitor 880.

The D input terminal and the inverted clear input terminal of a D flip-flop 882 are connected to a set/clear timing input terminal 884. The D flip-flop 882 is triggered by a trigger signal on an input terminal 886. The inverted Q output terminal of the D flip-flop 882 is connected to the gate terminal of a shunt MOSFET transistor 888, which shunts the capacitor 880 until the trigger pulse is received allowing the voltage ramp to begin.

The D input terminal of another D flip-flop 890 is connected to the Q terminal of the D flip-flop 882. The inverted clear input terminal of the D flip-flop is connected to the set/clear timing input terminal 884.

When the magnitude of the voltage ramp signal at the positive input terminal for the comparator exceeds the value of the error signal voltage on the negative input terminal of the comparator, the comparator produces a positive output signal which activates the clock terminal of the D flip-flop circuit 890. The Q output terminal of the D flip-flop 890 is connected to the gate terminal of another shunt MOSFET transistor 892 which commutates the charging current out of capacitor 880. The inverted Q terminal of the D flip-flop 890 drives an output terminal 894 through a NAND inverter 889.

The linear voltage ramp is provided by a circuit based on a constant current source charging a capacitor. The slope of the voltage ramp is set by the magnitude of the current being supplied by the constant current source. The constant current source circuit includes operational amplifier 870 transistor 874 and resistor 872. The current magnitude is determined by the equation $$i = \frac{V_{cc} - V_{in}}{R_{872}} \quad (5)$$

Where $V_{in}$ is the voltage applied to the positive input terminal of operational amplifier 870 and $V_{cc}$ is +15 volts. The slope of the voltage ramp is changed by changing $V_{in}$. Manual control of the voltage ramp slope is accomplished by connecting the terminals of a potentiometer 895, as shown in the figure and removing amplifier 864. $V_{in}$ is then determined by the voltage divider formed by resistors 896, 897 and the potentiometer 895. The arm of the potentiometer 895 is connected to a terminal 898 which is connected to the positive input terminal of the op amp 870.

Feedback control of the slope of the voltage ramp is accomplished by generating the required value of $V_{in}$ with the feedback loop consisting of an instrumentation amplifier 864, an op amp stage 862, a multiplier circuit 860, and an op amp 816. The required value of $V_{in}$ is generated based on the derivation shown below.

The selection of the proper voltage ramp slope in the jitter compensation circuit minimizes the jitter in the output pulse of the magnetic modulator. To construct a feedback circuit to generate the proper voltage ramp slope, it is necessary to determine the voltage ramp slope as a mathematical function of the magnetic properties of the PPE modulator and the constant current source of the jitter compensation voltage ramp circuit.

The voltage ramp is compared to the voltage applied to negative input of comparator 870, which is defined as $V_{error}$.

$$V_{error} = \frac{G}{200}(V_{inst} - 0.975 V_{ave}) \quad (6)$$

Where G is equal to ten, $V_{inst}$ is the sampled voltage value on capacitor $C_o$ of the PPE magnetic modulator, and $V_{ave}$ is the average of the last one hundred thousand samples of voltage $V_{inst}$. We will neglect the factor 0.975 used with $V_{ave}$. The linear voltage ramp generated by the jitter compensation circuit is given below.

$$V = \frac{V_{cc} - V_{in}}{872 C_{880}} \quad (7)$$

Where $V_{cc}$ represents the dc rail voltage of fifteen volts, the change in time delay in the jitter compensation circuit for a value of $V_{inst}$ that varies from $V_{ave}$ by a small positive voltage ($\Delta V$) is given below.

$$T_{de}^+ = \frac{(V_{ave} - \Delta V) G R_{872} C_{880}}{200(Vcc - Vin)} \quad (8)$$

Similarly, the change in time delay for a value of $V_{inst}$ that varies from $V_{ave}$ by a small negative voltage ($\Delta V$) is given as:

$$T_{de}^- = \frac{(V_{ave} + \Delta V) G R_{872} C_{880}}{200(Vcc - Vin)} \quad (9)$$

The total range of time delay through the jitter compensation circuit for a variation in $V_{inst}$ of plus or minus $\Delta V$ about $V_{ave}$ is the difference of equations (8) and (9) and can be written as:

$$\Delta T_{de} = \frac{(2\Delta V) G R_{872} C_{880}}{200(Vcc - Vin)} \quad (10)$$

The change in time delay through the magnetic compression circuits of the PPE modulator for a value of $V_{inst}$ that varies from $V_{ave}$ by a positive amount of voltage $\Delta V$ is:

$$T_{mag}^+ = \frac{V_{nom} T_{dnom}}{(V_{ave} + \Delta V)} \quad (11)$$

Similarly, the change in time delay through the magnetic compression circuits for a value of $V_{inst}$ that varies from $V_{ave}$ by a negative $\Delta V$ is:

$$T_{mag}^- = \frac{V_{nom} T_{dnom}}{(V_{ave} + \Delta V)} \quad (12)$$

The total range of time delay through the magnetic compression circuits for a voltage variation of plus or minus $\Delta V$ is to the difference of equations (11) and (12) and is equal to:

$$\Delta T_{mag} = \frac{2 V_{nom} T_{dnom} \Delta V}{(V_{ave}^2 - \Delta V^2)}$$

$\Delta T_{de}$ must cancel $\Delta T_{mag}$ for successful jitter compensation. This is accomplished through the selection of the proper slope of the voltage ramp. $V_{in}$ is the variable that determines the slope of the voltage ramp. The proper value of $V_{in}$ for jitter compensation can be obtained setting equations (10) and (13) equal to one another and solving for $V_{in}$.

$$V_{in} = V_{cc} - \frac{R_{872} C_{880} G (V_{ave}^2 - \Delta V^2)}{200 V_{nom} T_{dnom}}$$

Since $V_{ave}$ is much greater than $\Delta V$ the term may be neglected. This results in the following equation for $V_{in}$.

$$V_{in} = V_{cc} - \frac{R_{872} C_{880} G V_{ave}^2}{200 V_{nom} T_{dnom}}$$

Equation (15) gives $V_{in}$ in terms of the average voltage on charge capacitor $C_o$, the voltseconds of the PPE modulator magnetic compression circuits, the gain of the differential amplifier of the jitter compensation error circuit and the resistor and capacitor values of the jitter compensation voltage ramp circuit. All these values are known through measurement, or component design. This knowledge is used to form the feedback loop including an instrumentation amplifier 864, an op amp stage 862, a multiplier circuit 860, and an op amp 816. The feedback loop provides for tolerances in magnetic compression circuit voltseconds between different modulators and jitter compensation circuit resistors and capacitors. The slope of the voltage ramp changes with $V_{ave}$ as the modulator operating voltage is changed. The proper slope is maintained over an operating range of 300 volts about the initial operating point. The advantage of this feedback circuit is that manual adjustment of the voltage ramp slope is no longer needed after the feedback circuit is initialized at an operating point.

The above sections describe the manual and feedback control of the slope of the voltage ramp in the jitter compensation circuit. Full remote controls of the slope of the jitter compensation voltage ramp would be advantageous in that no manual adjustments would be required on operating laser packages. A single operator sitting at a computer control console could adjust the jitter compensation circuit of all the lasers of a system. Full remote jitter compensation is obtained by replacing the manual potentiometer 895 with a digitally controlled potentiometer. A Dallas Semiconductor digitally controlled potentiometer model DS1267-10 is an integrated circuit module which contains two digitally controlled 10 kOhm potentiometers that are electrically connected in series for this application. An output voltage is obtained from resistive divider formed by the potentiometer and two fixed resistors connected respectively between a positive voltage source or ground and one respective terminal of the resistance element of the digitally controlled potentiometer. The output voltage is amplified by a suitable factor to obtain the proper value of $V_{in}$ for the jitter compensation circuit. The amplified output voltage is then applied to terminal 898 to provide full remote operation.

Figure 9:
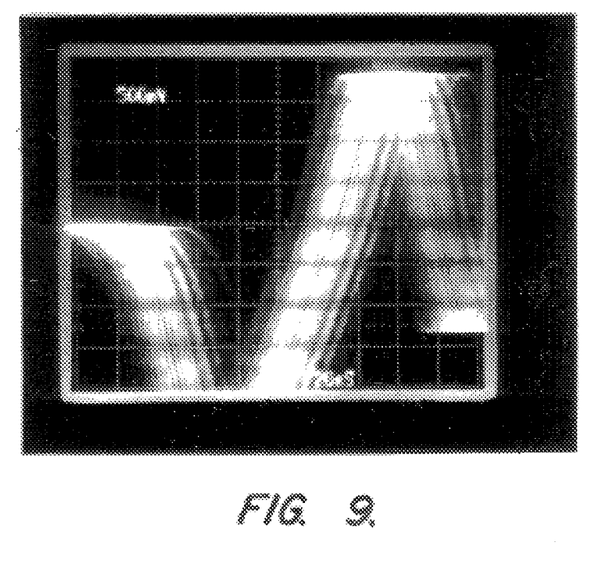
FIG. 9 is a waveform diagram of an output pulse for the system having the characteristic of FIG. 6 with the jitter compensation circuit deactivated, showing peak-to-peak jitter of approximately 50 nanoseconds.

FIG. 9 is a waveform diagram showing that the effect of variations in the voltage supply for the system of FIG. 1 produce peak-to-peak jitter of approximately 50 nanoseconds. The jitter compensation circuit is deactivated.

Figure 10:
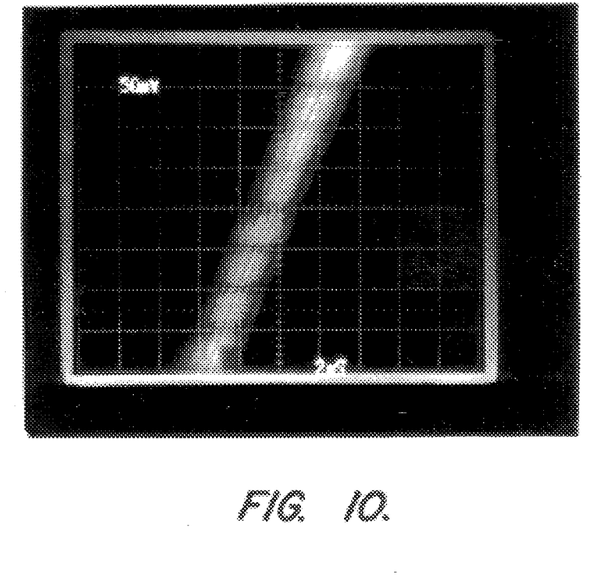
FIG. 10 is a waveform diagram of an output pulse for the system of FIG. 7 with the jitter compensation circuit activated, according to the invention, showing peak-to-peak jitter of approximately 2 nanoseconds where the oscillogram has 2 ns/div sensitivity.

FIG. 10 is an oscillogram of an output pulse applied to the load (104) of FIG. 1, according to the invention, showing peak-to-peak jitter of approximately 3 nanoseconds. The jitter is measured on output pulses from a modulator driving a gas discharge load. The jitter compensation system according to the invention is successful in reducing the output jitter from 60 nsec to 3 ns at an operating voltage of 590 volts on the switching power supply.

The foregoing descriptions of specific embodiments of the present invention have been presented for the purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A jitter compensation system for forming a trigger signal for a voltage-dependent magnetic modulator which is powered from an energy storage capacitor having a $V_{co}$ voltage, said system comprising:

sampling means for sampling a signal representative of the $V_{co}$ voltage and for providing sampled $V_{co}$ signals;

averaging means for averaging the sampled $V_{co}$ signal signals to provide an average $V_{co}$ signal;

difference means for taking the difference between the average $V_{co}$ signal and each of the sampled $V_{co}$ signals and for providing a difference signal corresponding to each of the sampled $V_{co}$ signals;

means for generating a voltage ramp signal;

comparator means, having a first input terminal for receiving the difference signal and having a second input terminal for receiving the voltage ramp signal, for providing an output trigger pulse when the voltage ramp signal exceeds the difference signal.

2. The jitter compensation system of claim 1 wherein the means for generating a voltage ramp signal includes:

means for squaring the average $V_{co}$ signal to provide a squared average $V_{co}$ signal;

means for generating a voltage ramp signal proportional to a squared average $V_{co}$ signal.

3. The jitter compensation system of claim 2 wherein the means for generating a voltage ramp signal proportional to a squared average $V_{co}$ signal includes:

current source means for providing an output current proportional to the squared average $V_{co}$ signal;

a capacitor for receiving the output current of the current source means so that the voltage ramp signal is proportional to the squared average $V_{co}$ signal.

4. The jitter compensation system of claim 1 means for scaling the average $V_{co}$ signal by 0.975.

5. The jitter compensation system of claim 1 including wherein the sampling means includes a sample and hold circuit.

6. A jitter compensation system for forming a trigger signal for a voltage-dependent magnetic modulator which is powered from an energy storage capacitor having a $V_{co}$ voltage, said system comprising:

sampling means for sampling a signal representative of the $V_{co}$ voltage and for providing sampled $V_{co}$ signals;

averaging means for averaging the sampled $V_{co}$ signal signals to provide an average $V_{co}$ signal;

difference means for taking the difference between the average $V_{co}$ signal and each of the sampled $V_{co}$ signals and for providing a difference signal corresponding to each of the sampled $V_{co}$ signals;

means for squaring the average $V_{co}$ signal to provide a squared average $V_{co}$ signal;

means for generating a voltage ramp signal proportional to a squared average $V_{co}$ signal;

comparator means, having a first input terminal for receiving the difference signal and having a second input terminal for receiving the voltage ramp signal, for providing an output trigger pulse when the voltage ramp signal exceeds the difference signal.

7. A method for reducing voltage-dependent timing variations in a pulsed magnetic modulator, where the timing variations are caused by variations in the $V_{co}$ voltage provided on an energy storage capacitor, comprising the steps of:

sampling the $V_{co}$ voltage to provide a plurality of sampled $V_{co}$ signals;

averaging the plurality of sampled $V_{co}$ signals to provide an averaged $V_{co}$ signal;

taking the difference between the averaged $V_{co}$ signal level and each of the sampled $V_{co}$ signals and providing a difference signal for each of said plurality of sampled $V_{co}$ signals;

squaring each of the sampled $V_{co}$ signals to provide squared sampled $V_{co}$ signals;

generating a voltage ramp signal for each sampled $V_{co}$ signal, where the voltage ramp signal has a slope proportional to the squared sampled $V_{co}$ signal;

comparing the difference signal with the voltage ramp signal and providing an output trigger pulse when the voltage ramp signal exceeds the difference output signal.

* * * * *